US007745973B2

(12) United States Patent
Bayram et al.

(10) Patent No.: US 7,745,973 B2
(45) Date of Patent: Jun. 29, 2010

(54) ACOUSTIC CROSSTALK REDUCTION FOR CAPACITIVE MICROMACHINED ULTRASONIC TRANSDUCERS IN IMMERSION

(75) Inventors: Baris Bayram, Stanford, CA (US); Butrus T. Khuri-Yakub, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 483 days.

(21) Appl. No.: 11/789,210

(22) Filed: Apr. 23, 2007

(65) Prior Publication Data

US 2008/0259725 A1 Oct. 23, 2008

Related U.S. Application Data

(60) Provisional application No. 60/797,489, filed on May 3, 2006.

(51) Int. Cl.
*H01L 41/08* (2006.01)

(52) U.S. Cl. ...................................................... 310/328

(58) Field of Classification Search ................. 310/309, 310/311, 324, 320, 327; 367/181, 163; 600/459, 600/437; *H04R 19/00, 1/00*

See application file for complete search history.

(56) References Cited

U.S. PATENT DOCUMENTS

| | | | | |
|---|---|---|---|---|
| 5,619,476 | A | 4/1997 | Haller et al. | |
| 6,443,901 | B1 | 9/2002 | Fraser | |
| 6,503,204 | B1 | 1/2003 | Sumanaweera et al. | |
| 7,030,536 | B2 | 4/2006 | Smith et al. | |
| 7,408,283 | B2 * | 8/2008 | Smith et al. | 310/309 |
| 7,545,075 | B2 * | 6/2009 | Huang et al. | 310/309 |
| 2005/0200241 | A1 | 9/2005 | Degertekin | |

* cited by examiner

*Primary Examiner*—Walter Benson
*Assistant Examiner*—Karen B Addison
(74) *Attorney, Agent, or Firm*—Lumen Patent Firm

(57) ABSTRACT

A reduced crosstalk capacitive micromachined ultrasonic transducer (CMUT) array is provided. The CMUT array has at least two CMUT array elements deposited on a substrate, at least one CMUT cell in the array element, a separation region between adjacent CMUT array elements, and a membrane formed in the separation region. The membrane reduces crosstalk between adjacent array elements, where the crosstalk is a dispersive guided mode of an ultrasonic signal from the CMUT propagating in a fluid-solid interface of the CMUT array. Each cell has an insulation layer deposited to the substrate. A cell membrane layer is deposited to the insulation layer, where the cell membrane layer has a vacuum gap therein. The cells further have an electrode layer deposited to a portion of the membrane layer, and a passivation layer deposited to the electrode layer, the cell membrane layer and to the insulation layer.

14 Claims, 9 Drawing Sheets

(c)

(d)

(a)

(b)

(c)

(d)

(a)

(b)

ACOUSTIC CROSSTALK REDUCTION FOR CAPACITIVE MICROMACHINED ULTRASONIC TRANSDUCERS IN IMMERSION

CROSS-REFERENCE TO RELATED APPLICATIONS

This application is cross-referenced to and claims the benefit from U.S. Provisional Patent Application 60/797,489 filed May 3, 2006 which is hereby incorporated by reference.

STATEMENT REGARDING FEDERALLY SPONSORED RESEARCH OR DEVELOPMENT

The present invention was supported in part by grant number HL67647 from the National Institute of Health, and supported in part by grant number N00014-02-1-0007 from the United States Office of Naval Research. The U.S. Government has certain rights in the invention.

FIELD OF THE INVENTION

The invention relates generally to capacitive micromachined ultrasonic transducers (CMUTs). More particularly, the invention relates to apparatus and methods for reducing acoustic crosstalk between the elements of CMUT arrays in immersion by placing a membrane in the separation region between neighboring array elements.

BACKGROUND

Microfabrication technology that employed the techniques originally developed for the integrated circuit (IC) industry has become popular in diverse areas of science and engineering to create miniaturized transducers. A transducer is a conduit for transforming energy between two or more domains such as mechanical, electrical, thermal, chemical and magnetic. Capacitive micromachined ultrasonic transducers (CMUTs) relate electrical and mechanical domains in energy transfer to transmit and receive ultrasound. As an alternative to piezoelectric transducers, CMUTs offer several advantages such as wide bandwidth, ease of large array fabrication and potential for integration with electronics. Parasitic energy coupling, or crosstalk, between neighboring elements has been observed in immersed operation. It has been determined that the main crosstalk mechanism is a dispersive guided mode propagating in the fluid-solid interface. This coupling degrades the performance of transducers in immersion for medical applications such as diagnostic imaging and high intensity focused ultrasound (HIFU) treatment.

Experimental, analytical and finite element methods have been used to understand the causes and effects of crosstalk in CMUTs. Attempts have been made to reduce the crosstalk, such as changing the substrate thickness and placing etched trenches or polymer walls between the array elements. These efforts were explored using finite element methods. These methods did not significantly affect the crosstalk observed to be −22 dB in immersion.

Another attempt, based on a mathematical CMUT model, covered the top of the array with a thin, lossy solid layer was found to damp out the unwanted resonances that occur on certain frequencies and steering angles due to the coupling in the acoustic medium. However the problem of reducing the dispersive guided mode of an ultrasonic signal remained unaddressed.

Accordingly, there is a need to develop a CMUT array that has reduced crosstalk between the neighboring array elements. There is a further need to improve transducer performance for applications such as diagnostic imaging and high intensity focused ultrasound (HIFU) treatment in medicine. A need exists to reduce the effective element aperture and the ringdown time of a transducer, and improve angular response and range resolution. Further, it would be considered an innovative step with CMUT arrays to improve the axial resolution and bright patterns in the near field.

SUMMARY OF THE INVENTION

The present invention provides a reduced crosstalk capacitive micromachined ultrasonic transducer (CMUT) array. The CMUT array has at least two CMUT array elements deposited on a substrate, at least one CMUT cell in the array element, a separation region between adjacent CMUT array elements, and a membrane formed in the separation region. The membrane reduces crosstalk between the adjacent array elements, where the crosstalk is a dispersive guided mode of an ultrasonic signal from the CMUT propagating in a fluid-solid interface of the CMUT array.

In one aspect of the invention, all the separation regions between the elements are substantially the same, whereby forming a substantial periodicity of the CMUT elements within the CMUT array. In another aspect of the invention, the periodicity of the array elements is in one dimension, and in another aspect, the periodicity of the array elements is in two dimensions.

In another aspect of the invention, the separation regions are substantially the same, forming a substantial periodicity of the CMUT elements within the CMUT array. In yet another aspect, the CMUT cells within the elements are substantially the same, forming a substantial periodicity of the CMUT cells within the CMUT element.

In another aspect of the invention, the CMUT operates in a conventional mode or a collapsed mode to transmit and receive ultrasound.

In a further aspect of the invention, the CMUT cell has an insulation layer deposited to the substrate, a cell membrane layer deposited to the insulation layer, where the cell membrane layer has a gap therein. The CMUT cell further has an electrode layer deposited to the membrane layer, where the electrode layer covers a portion of said membrane layer, and a passivation layer. The passivation layer is deposited to the electrode layer, the cell membrane layer and to the insulation layer.

In one embodiment of the invention, the gap is a vacuum gap.

In another embodiment of the invention, the CMUT cell may have a geometry such as circular, square, hexagonal or tented.

In another aspect of the invention, the insulation layer may be made from silicon nitride or silicon oxide. In a further aspect the membrane layer may be made from silicon nitride or silicon oxide. In yet another aspect, the electrode layer may be made from aluminum or gold. In a further aspect, the passivation layer may be made from silicon nitride or silicon oxide.

BRIEF DESCRIPTION OF THE FIGURES

The objectives and advantages of the present invention will be understood by reading the following detailed description in conjunction with the drawing, in which:

FIG. 1(*b*) shows a planar cross-section view of the separation region between the closest cells of the neighboring array elements of a reduced crosstalk CMUT array (modified array) according to the present invention.

FIG. 2(*b*) shows a magnified view of the top surface of the separation region and neighboring cells of Element 18 and Element 19 of FIG. 2(*a*).

FIG. 2(*c*) shows a side view of the separation region and the cells for a regular CMUT array: bulk substrate in the separation region.

FIG. 2(*d*) shows side view of the separation region and the cells for a reduced crosstalk CMUT array (modified array): membrane formed in the separation region according to the current invention.

FIG. 3(*b*) shows crosstalk waves of the reduced crosstalk CMUT array (modified array): displacement results in the time-spatial domain according to the current invention.

FIG. 3(*c*) shows pressure results for the regular CMUT array in the time-spatial domain.

FIG. 3(*d*) shows pressure results for the reduced crosstalk CMUT array (modified array) in the time-spatial domain according to the current invention.

FIG. 3(*e*) shows pressure results for the regular CMUT array in the frequency-wavenumber domain.

FIG. 3(*f*) shows pressure results for the reduced crosstalk CMUT array (modified array) in the frequency-wavenumber domain array according to the current invention.

FIG. 4(*b*) shows crosstalk normalized amplitudes of array elements averaged over the array elements: pressure results for regular array and reduced crosstalk CMUT array (modified array).

FIG. 5(*b*) shows acoustic output pressure of the transmitter element averaged over the transmitter element: frequency-wavenumber domain for regular array and reduced crosstalk CMUT array (modified array).

FIG. 6(*b*) shows acoustic crosstalk pressure on the $5^{th}$ neighboring element: frequency-wavenumber domain for regular array and reduced crosstalk CMUT array (modified array).

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

The premise of crosstalk reduction stems from several observations and how they relate to the current invention to reduce the crosstalk, the observations are as follows:

1) The main crosstalk mechanism is the dispersive guided mode (−23 dB) propagating in the fluid-solid interface compared to $A_0$ (−40 dB) and $S_0$ (−65 dB) Lamb Wave modes. The current invention reduces the crosstalk and impedes the propagation of this guided mode.
2) This guided mode disappears close to 4 MHz, corresponding to the membrane resonance in immersion. Although the 3-dB bandwidth of the transmitter array element extends from 2 MHz to 9.6 MHz, this guided mode is not observed above the cut-off frequency of 4 MHz. This result shows the strong influence of the membranes on top of the array elements to affect the spectra of the crosstalk.
3) This guided mode has the peak at 2.3 MHz with a narrowband. Therefore, by only impeding the propagation of the guided mode at a frequency in the vicinity of 2.3 MHz the crosstalk is sufficiently reduced.

Figure 1:
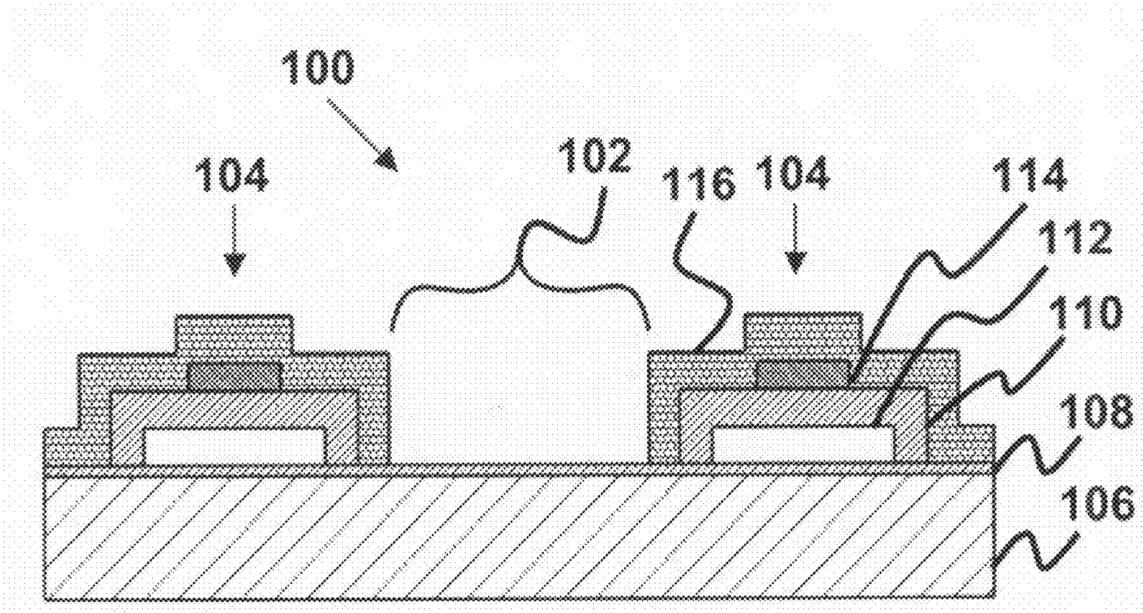
FIG. 1(*a*) shows a planar cross-section view of the separation region between the closest cells of the neighboring array elements.
Figure 1:
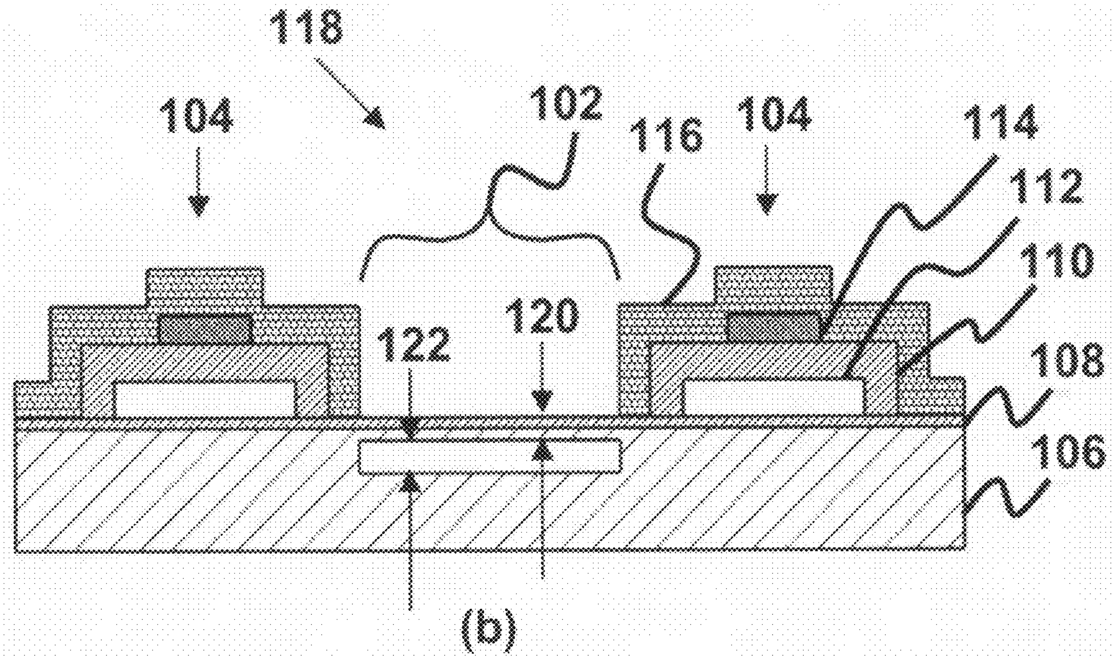

From the second observation, the invention provides a periodic arrangement of a membrane between the array elements such that the propagation of the guided mode is impeded at a frequency close to the center frequency of the guided mode. FIG. 1(*a*) shows a cross-section view of a prior art CMUT array 100, where shown is a separation region 102 between the closest cells 104 of the neighboring array elements (see FIGS. 2). The regular CMUT array 100 has a bulk substrate 106 in the separation region 102 between the elements (see FIGS. 2). The CMUT cell 104 has an insulation layer 108 deposited to the substrate 106, a cell membrane layer 110 deposited to the insulation layer, where the cell membrane layer has a gap 112 therein. The CMUT cell 104 further has an electrode layer deposited 114 to the membrane layer 110, where the electrode layer 114 covers a portion of said membrane layer 110, and a passivation layer 116. The passivation layer 116 is deposited to the electrode layer 114, the cell membrane layer 110 and to the insulation layer 108.

FIG. 1(*b*) shows a cross-section view of a reduced crosstalk CMUT array 118, where a membrane 120 is formed in the separation region 102 according to the current invention by creating a vacuum gap 122 right below the membrane 120. This modification does not affect the static behavior of the cells 104 (voltage-capacitance relation and the collapse voltage) in the elements. In this embodiment of the invention, FIG. 1(*b*) shows each CMUT cell 104 having an insulation layer 108 deposited to the substrate 106, where the insulation layer 108 may be a silicon nitride layer or a silicon oxide layer. Further shown is a cell membrane layer 110 deposited to the insulation layer 108, where the cell membrane layer 110 has a gap 112 therein. The cell membrane layer 110 may be a silicon nitride layer or a silicon oxide layer. According to one embodiment of the invention, the gap 112 is a vacuum gap. The CMUT cells 104 further have an electrode layer deposited 114 to the membrane layer 110, where the electrode layer 114 covers a portion of said membrane layer 110 and a passivation layer 116. The electrode layer 114 may be made from aluminum or gold. The passivation layer 116 is deposited to the electrode layer 114, the cell membrane layer 110 and to the insulation layer 108, where the passivation layer may be a silicon nitride layer or a silicon oxide layer.

Figure 2:
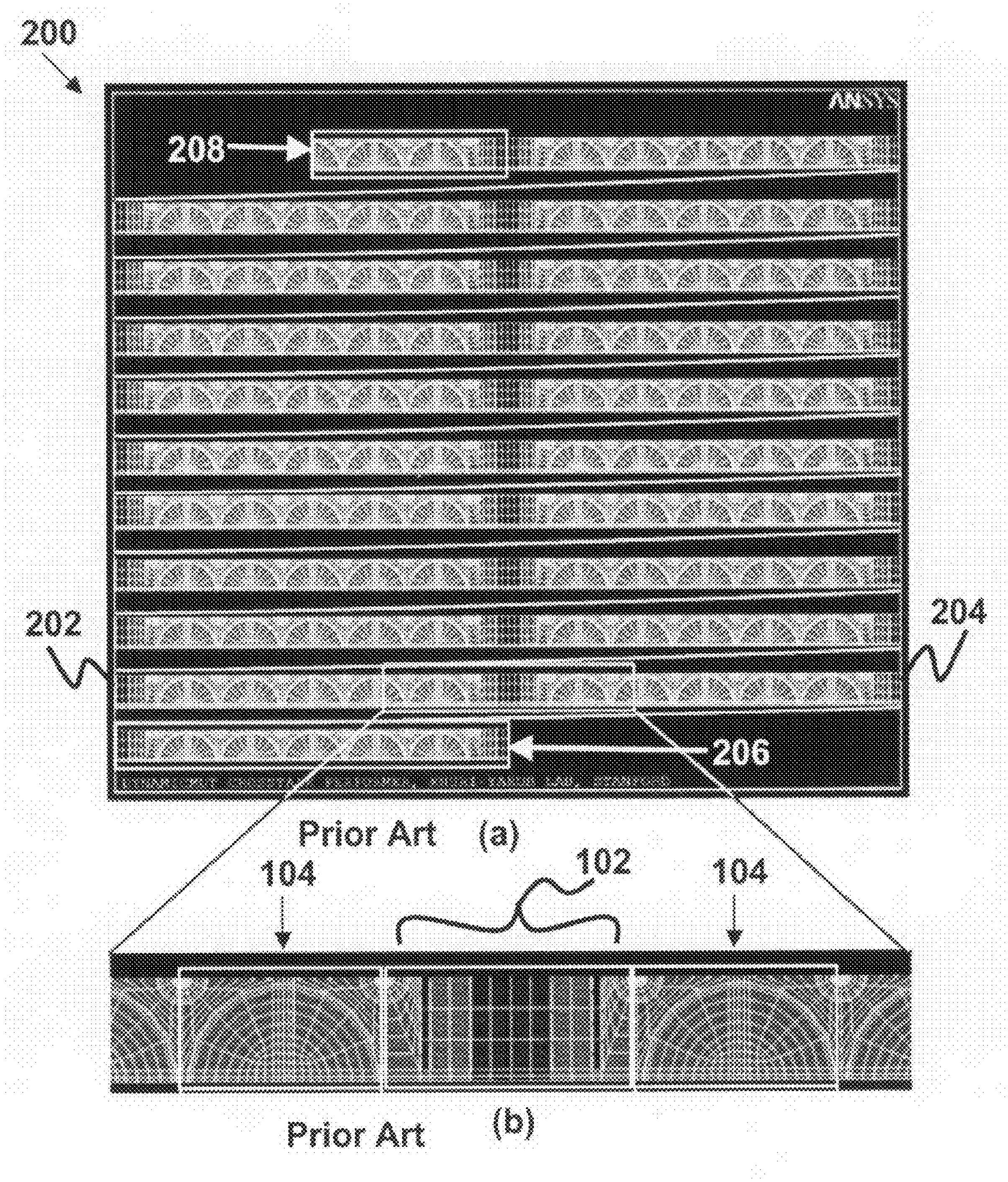
FIG. 2(*a*) shows a top view of finite element model (FEM) of the 1-D CMUT array surface.
Figure 2:
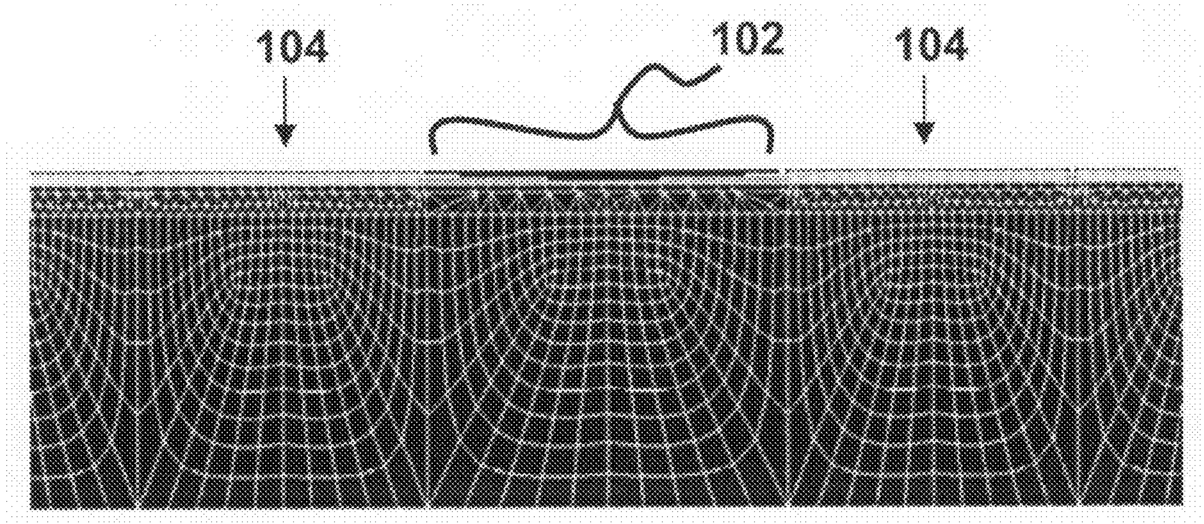
Figure 2:
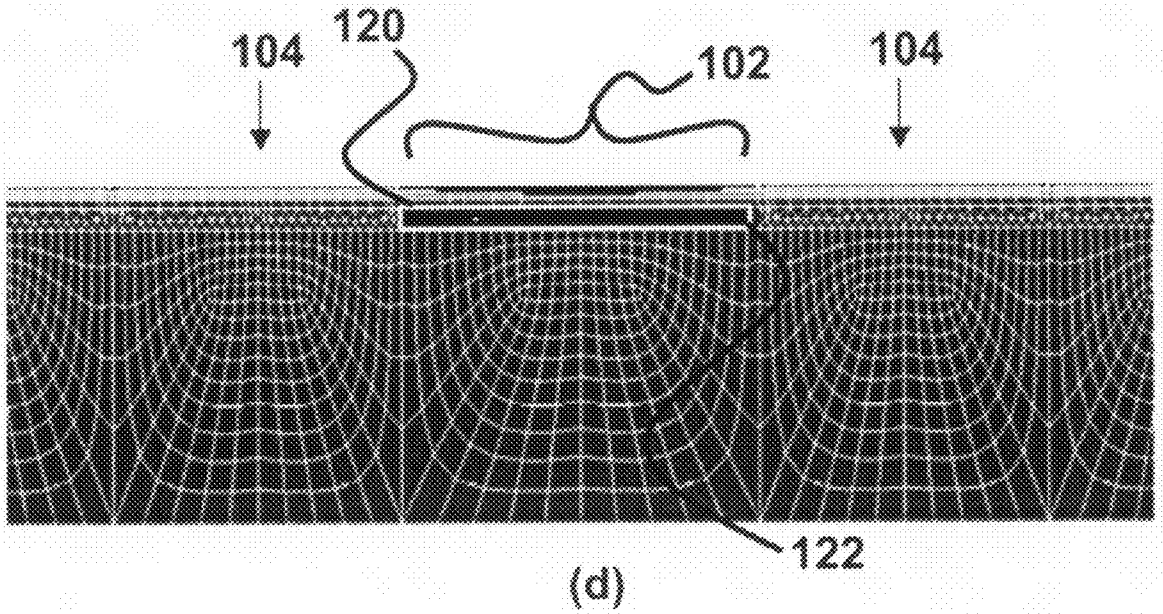

The current invention is based on a finite element analysis (FEA). Referring to FIGS. 2(*a*)-2(*d*), shown is a finite element model (FEM) of the 1-D CMUT array. FIG. 2(*a*) shows a top view of a one-half of a 41-element CMUT array 200 surface divided at the center symmetry plane. FIG. 2(*b*) shows a magnified, top view of a separation region 102 and neighboring cells 104 of Element 18 202 and Element 19 204. FIG. 2(*c*) show a side view of the separation region 102 and the cells 104 for a regular CMUT array 200, where shown is the bulk substrate 106 in the separation region 102. FIG. 2(*d*) shows a side view of the separation region 102 and the cells 104 for a reduced crosstalk CMUT array 118 having the membrane 120 formed in the separation region 102 by creating a vacuum gap 122 right below the membrane 120.

FIG. 2(*a*) shows a 3-D finite element model of a 1-D CMUT array that includes periodic array elements 206 on the surface of the substrate 106, where shown are five cells 104 in each element 206. Using the symmetries of the array, the CMUT model describes a CMUT array, 41-elements long in one dimension and infinite in the elevation direction, where FIG. 2(*a*) shows half of the transmitter element 208 and 20 neighboring array elements 206 on one side of the transmitter element 208. In the FEA model, the CMUT is immersed in soybean oil. The separation regions 102 between the elements 206 are substantially the same and form a substantial periodicity within the reduced crosstalk CMUT array 118. This periodicity can be in one dimension or in two dimensions. Additionally, all the membranes 120 in the separation regions 102 are substantially the same and form a substantial periodicity of the CMUT elements 206 within the reduced crosstalk CMUT array 118. Further, all the CMUT cells 104 within the elements 206 are substantially the same and form a substantial periodicity of the CMUT cells 104 within the CMUT elements 206.

The excited element (or transmitter element) 208 is the central element 206 in the 41-element CMUT array, covered with 20 elements 206 on both sides. The element pitch is 250 μm and each element 206 includes 5 circular cells 104 with a diameter of 40 μm. Therefore, a separation region of 50 μm in length exists between the closest cells of the neighboring elements. The cells 104 are shown as circular-shapes, however it should be obvious that the cells 104 can be square, hexagonal or tent shaped, where the tent shaped cell membrane is supported at the center, but it is free on the edges. The top and side views of the separation region 102 between Element 18 202 and Element 19 204 are shown in FIG. 2(*b*) and FIG. 2(*c*), respectively. The regular CMUT array 100 has the substrate 106 in the separation region 102. To model the reduced crosstalk CMUT array 118, the regular CMUT array 100 is modified to have a membrane 120 in the separation region 102 (FIG. 2(*d*)). The reduced crosstalk CMUT array 118 is identical to the regular array 100 in every aspect except the presence of a membrane 120 in each separation region 102. A gap 122 (see FIG. 1 (*b*)) of 3 μm in height and 50 μm in length extends over the whole separation region 102 in the elevation direction. The membrane 120 (see FIG. 1(*b*)) over the gap 122 is made of 1 μm silicon covered with 0.3 μm silicon nitride.

ANSYS/LS-DYNA, a commercially available FEM package, was used to define the solid geometry, to mesh the structure, and to generate the final input deck for the LSDYNA calculations. A DC voltage of 75 V was applied to all the elements 206 while operating in the conventional mode. Then a 20-ns, +10-V unipolar pulse was applied to the transmitter element 208. The pulse amplitude and duration were selected such that the array elements did not accidentally operate in collapsed, or collapse-snapback modes. The displacement and the pressure over the whole array surface were collected with a time step of 10 ns for a total time of 4 μs. The simulation was performed using LS-DYNA executable (ver. 970-5434d) on a workstation (dual-processor 3 GHz Dell Precision 470, Dell Inc., Round Rock, Tex.) with a Linux operating system (GNU) for both regular and modified CMUT arrays. For transducers operated in the collapsed mode, the cell membrane 110 is first subjected to a voltage higher than the collapse voltage, therefore initially collapsing the membrane cell 110 onto the insulation layer 108 on the substrate 106. Then, a bias voltage is applied having an amplitude between the collapse and snapback voltages. At this bias voltage, the center of the cell membrane 110 still contacts the insulation layer 108 on the substrate 106. By applying driving AC voltage or voltage pulse, harmonic membrane motion is obtained in a circular ring concentric to the center of a circular cell 104, for example. In this regime, between collapse and snapback, the CMUT has a higher eletromechanical coupling efficiency than it has when it is operated in the conventional pre-collapse mode.

The regular CMUT array 100 and reduced crosstalk CMUT array 118 are compared to show the effects of the crosstalk reduction. In the displacement of the regular CMUT array 100 presented in the time-spatial domain shown in FIG. 3(*a*), three components of crosstalk propagating with different phase velocities and signal strengths are observed. The fastest crosstalk component is the weakest, with −65 dB displacement amplitude relative to the transmitter 208, and corresponds to $S_0$ Lamb Wave mode. A slightly slower component ($A_0$ Lamb Wave mode) is observed at −40 dB level, and the slowest component is the strongest, at −23 dB. The main crosstalk mechanism is the dispersive guided mode propagating in the fluid-solid interface. The displacement results for the reduced crosstalk CMUT array 118, shown in FIG. 3(*b*), demonstrate that the dispersive guided mode is reduced in amplitude.

Figure 3:
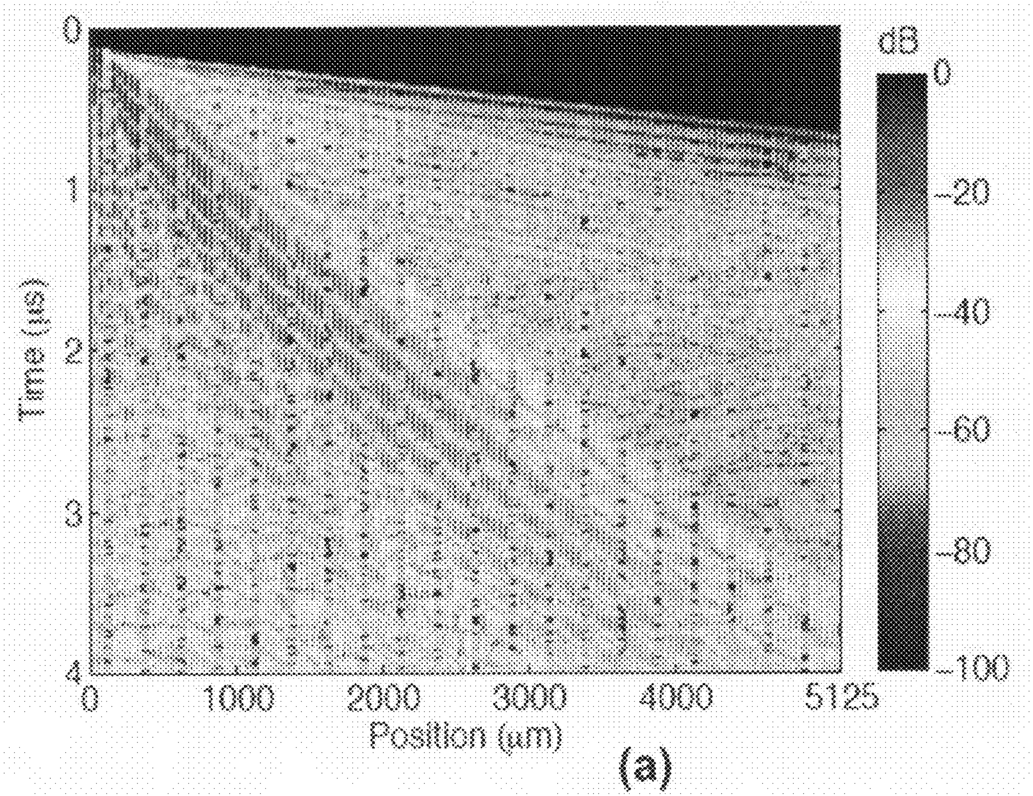
FIG. 3(*a*) shows crosstalk waves of the regular CMUT arrays: displacement results in the time-spatial domain.
Figure 3:
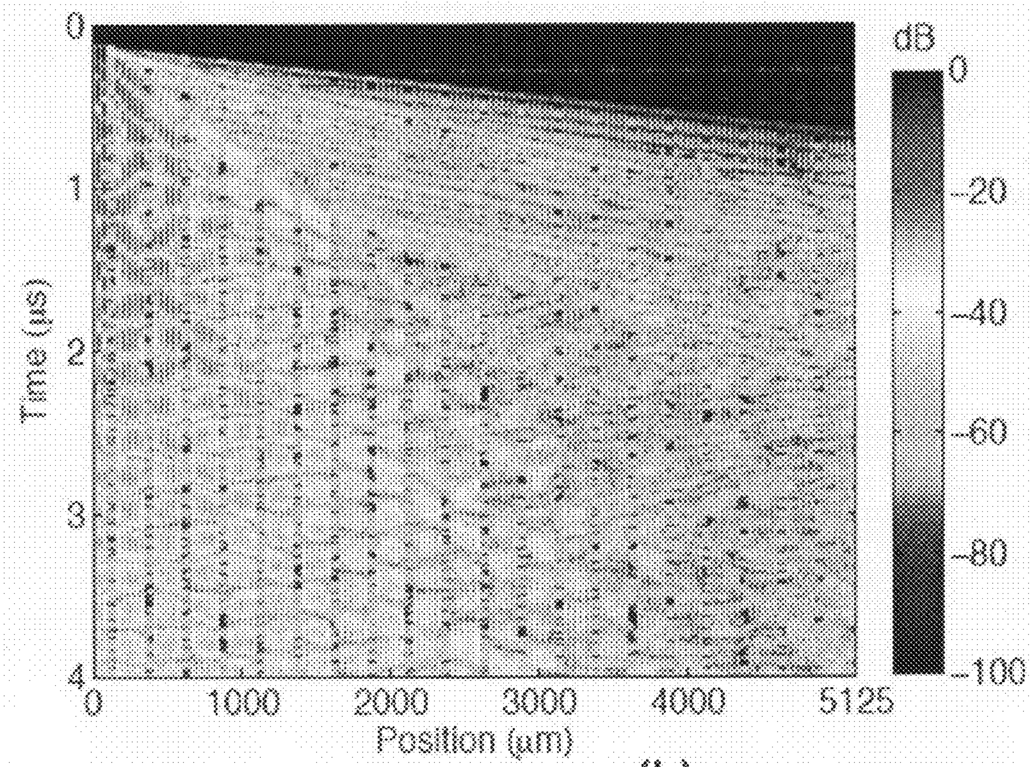
Figure 3:
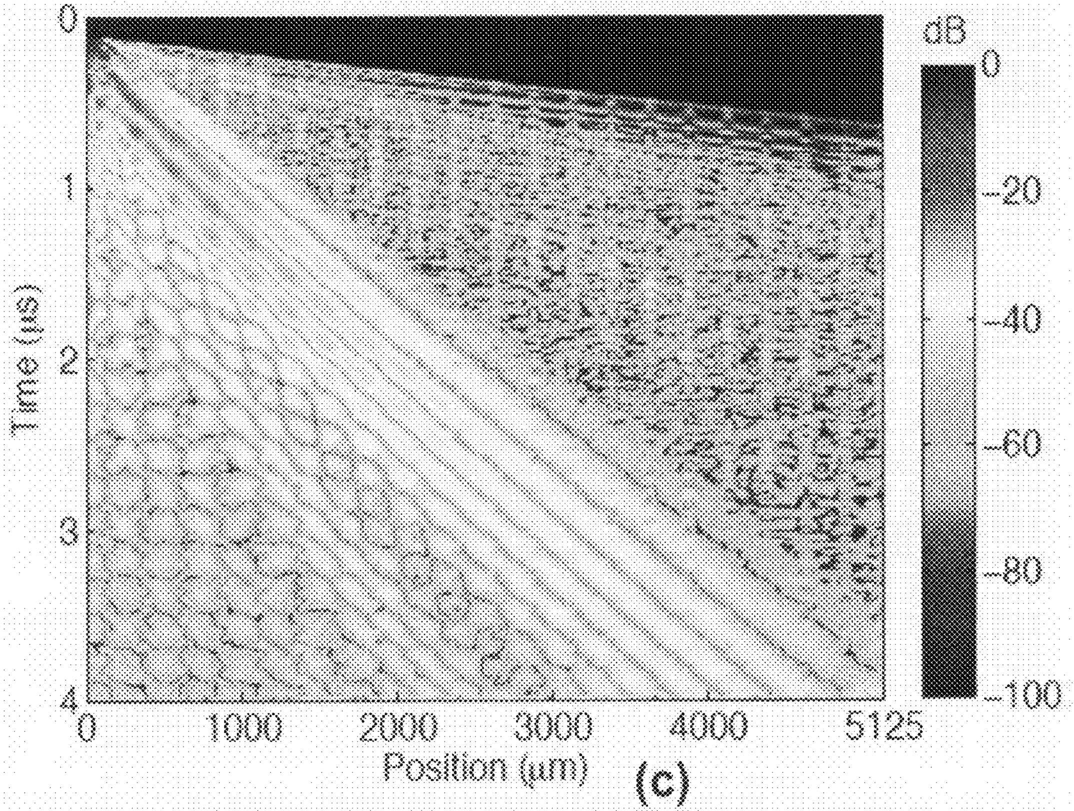
Figure 3:
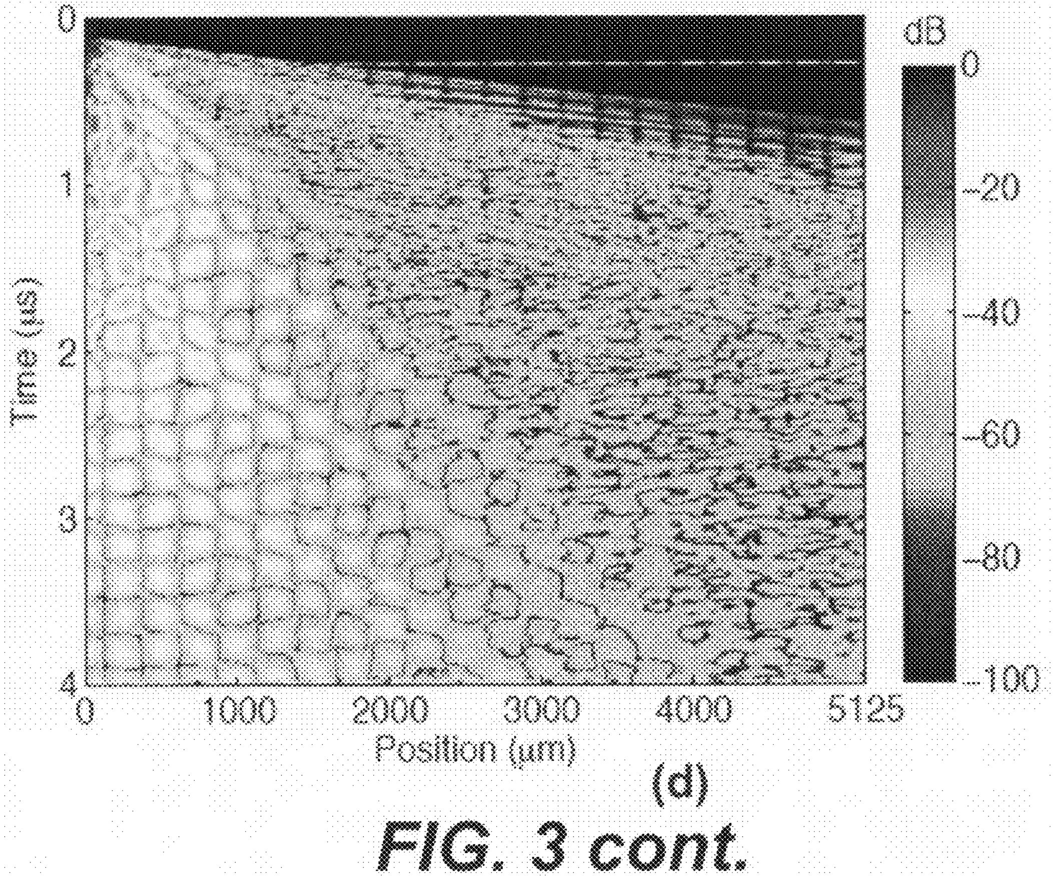
Figure 3:
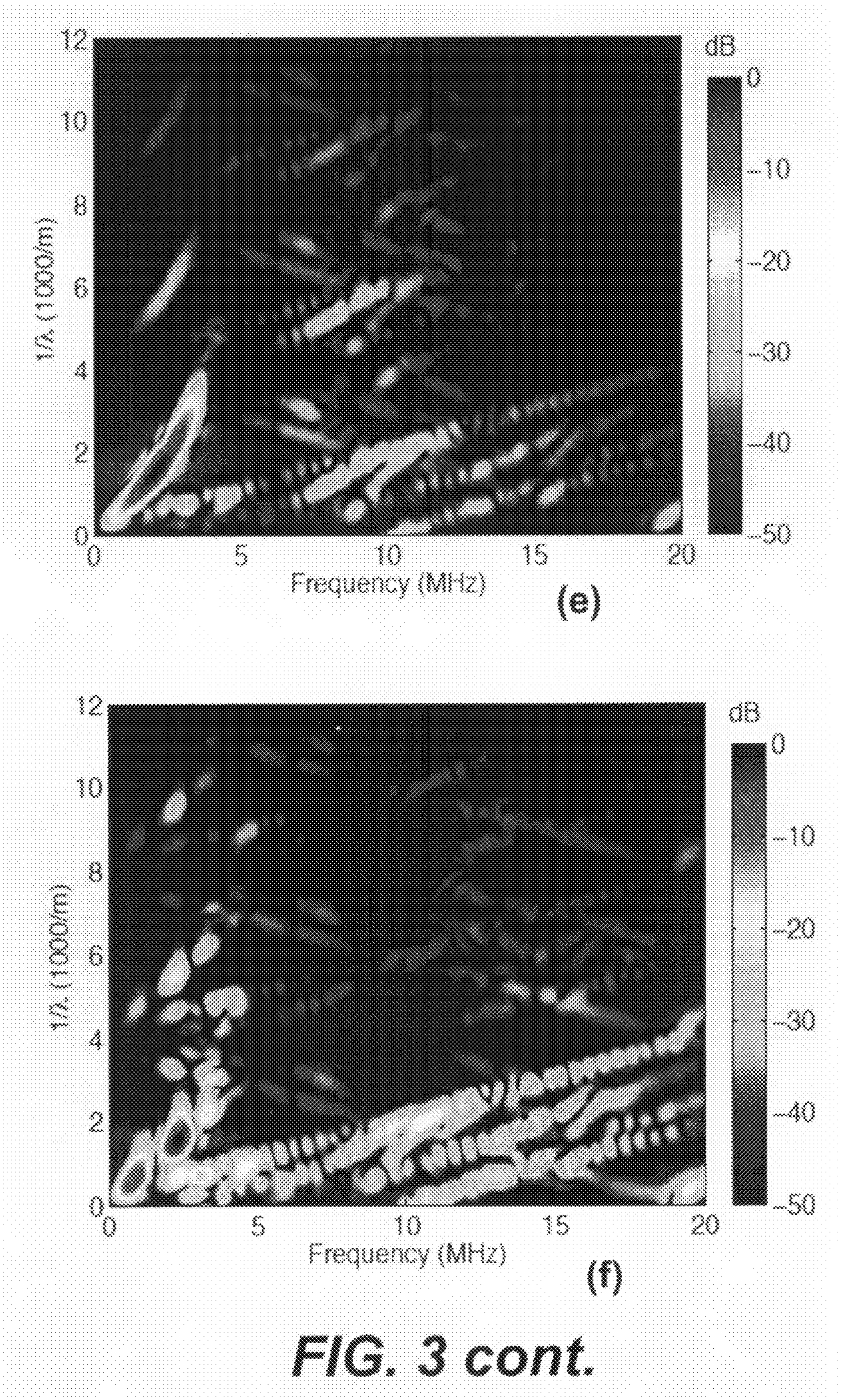

The components of crosstalk in the regular CMUT array 100 and reduced crosstalk in the modified CMUT array 118 are also observed in the pressure results in the time-spatial domain, shown in FIGS. 3(*c*) and 3(*d*).

Although the time-spatial domain representation provides insight about the nature of crosstalk, the identification of different wave types is difficult in this approach. Therefore, a transformation into the frequency-wavenumber domain is required to analyze propagating multi-mode signals. A hanning window is used to reduce the generation of the side lobes in the spectra.

The pressure results, presented in the frequency wavenumber domain, demonstrate the dispersive guided mode as the strongest component of the crosstalk for both regular CMUT array 100, shown in FIG. 3(*e*) and reduced crosstalk CMUT array 118 shown in FIG. 3(*f*). Both results are normalized to their respective maxima. Although the transmitter element 208 has a center frequency of 5.8 MHz with more than 130% fractional bandwidth, the dispersive guided mode for the regular array 100 has a single peak at 2.3 MHz, and the crosstalk amplitude decays rapidly away from this frequency. However, this mode for the reduced crosstalk CMUT array 118 has two peaks at 0.85 MHz and 2.3 MHz, separated with a dip occurring at 1.44 MHz.

Figure 4:
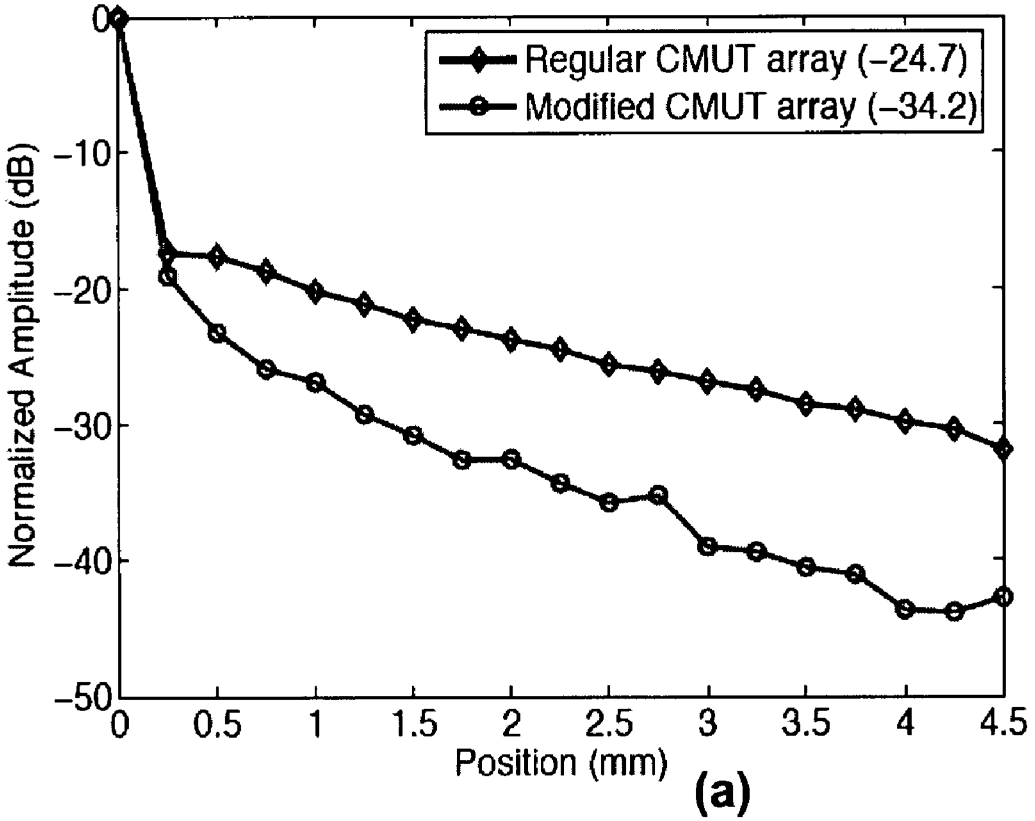
FIG. 4(*a*) shows crosstalk normalized amplitudes of array elements averaged over the array elements: displacement results for regular array and reduced crosstalk CMUT array (modified array).
Figure 4:
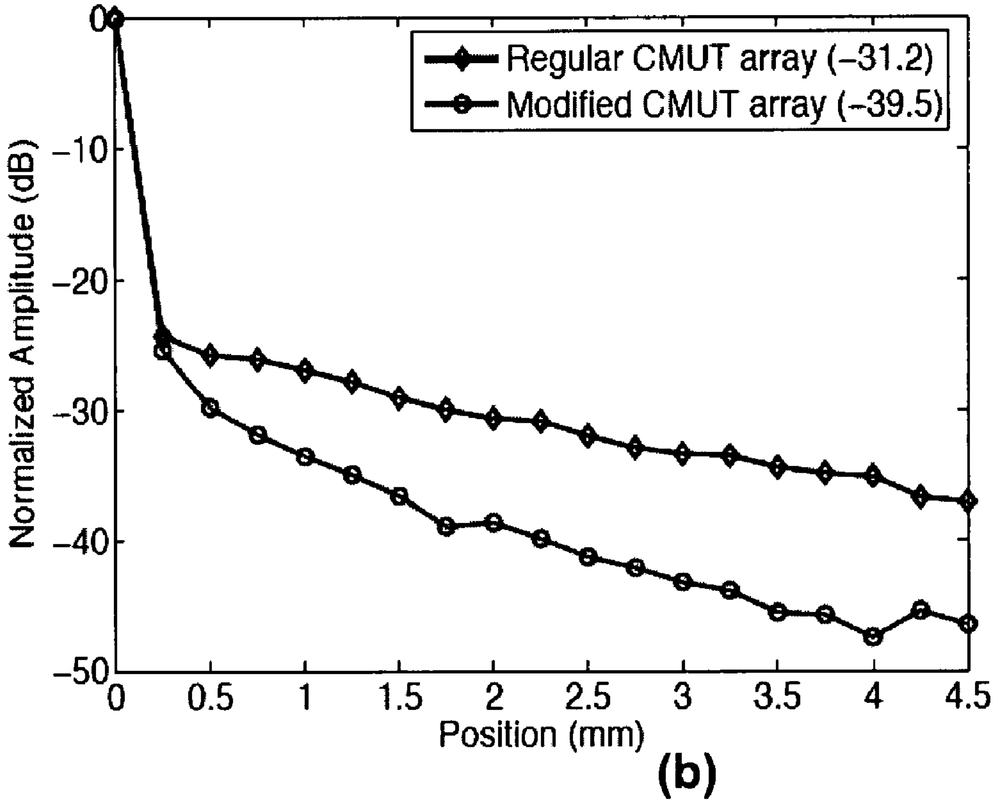

The crosstalk level, averaged over the array elements 206, is calculated for the displacement results, shown in FIG. 4(*a*) and the pressure results, shown in FIG. 4(*b*). The crosstalk level is reduced approximately 10 dB for the reduced crosstalk CMUT array 118 compared to the regular array 100.

Figure 5:
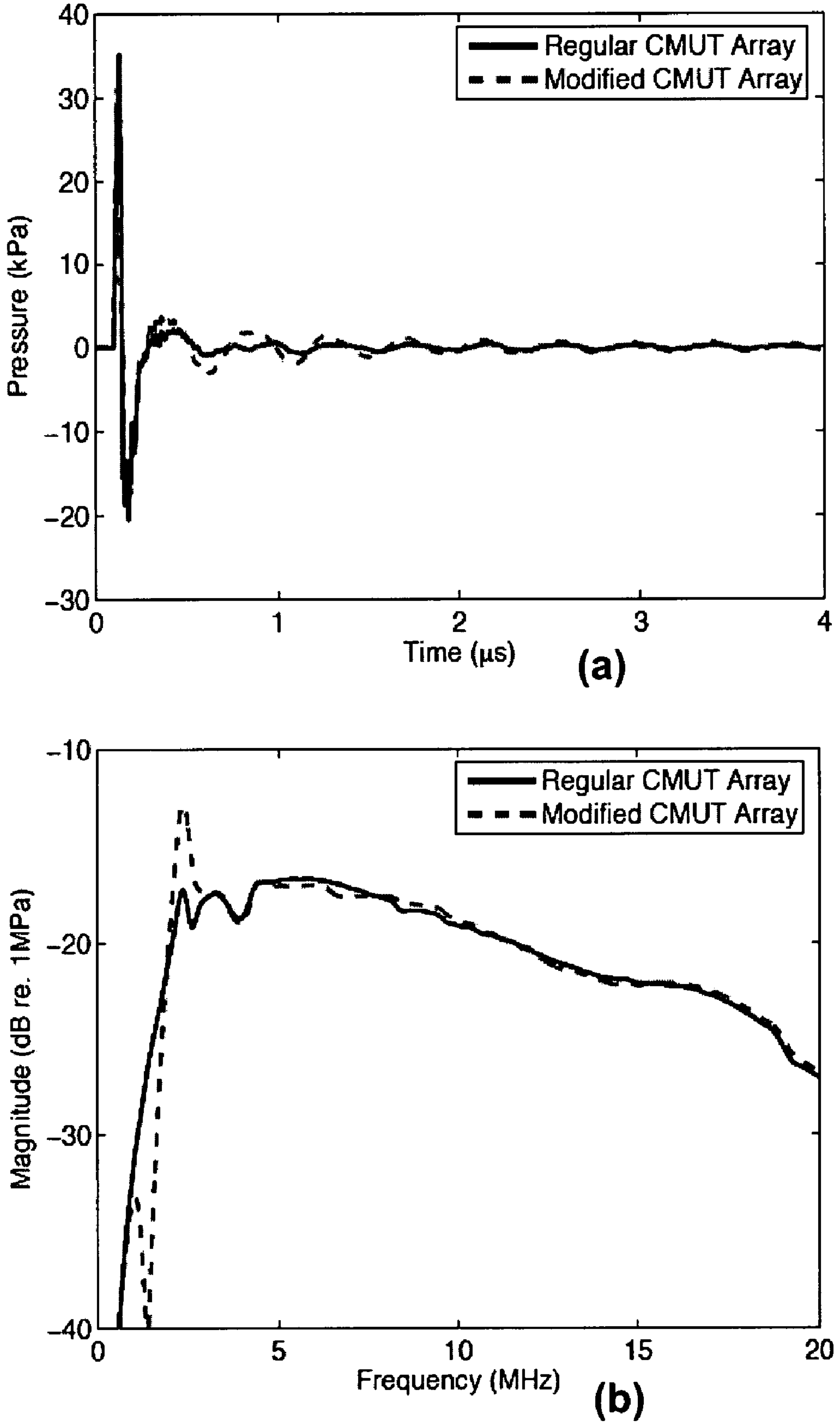
FIG. 5(*a*) shows acoustic output pressure of the transmitter element averaged over the transmitter element: time-spatial domain for regular array and reduced crosstalk CMUT array (modified array).

Acoustic pressure of the transmitter element 208 for the regular array 100 and reduced crosstalk CMUT array 118 is compared in the time-spatial domain, shown in FIG. 5(*a*). Peak-to-peak pressure of 55 kPa is achieved in both cases. This means that the acoustic output pressure of the transmitter element 208 is not degraded for the reduced crosstalk CMUT array 118. An increase in the ringing of the transmitter element 208 is observed for the reduced crosstalk CMUT array 118. The spectrum of the acoustic pressure in FIG. 5(*b*) show that the frequency of the ringing is 2.3 MHz, which corresponds to the center frequency of the guided mode. A dip at 1.44 MHz is observed in the reduced crosstalk CMUT array 118.

Figure 6:
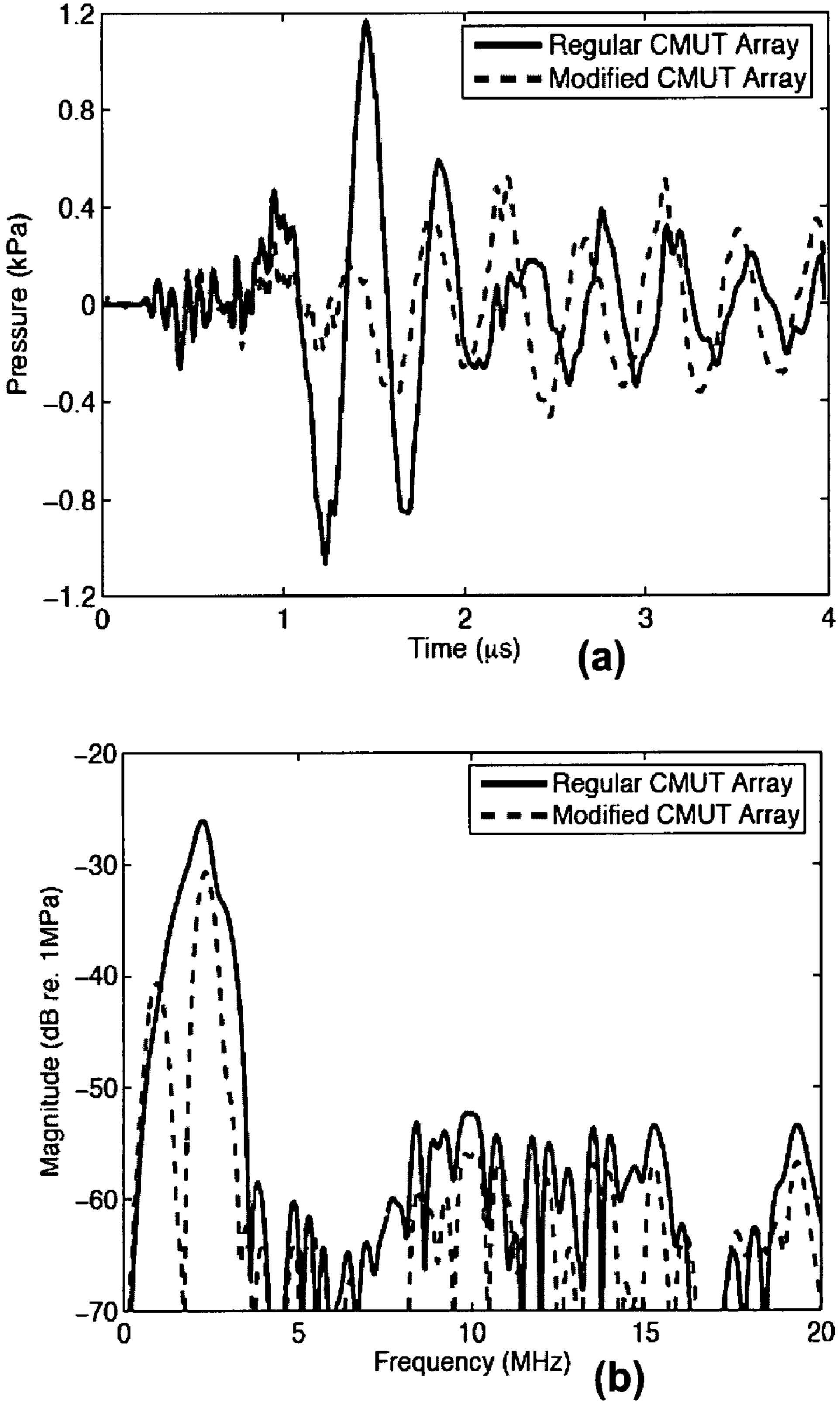
FIG. 6(*a*) shows acoustic crosstalk pressure on the $5^{th}$ neighboring element: time-spatial domain for regular array and reduced crosstalk CMUT array (modified array).

Acoustic crosstalk pressure on the $5^{th}$ neighboring element 206 for the regular array 100 and the reduced crosstalk CMUT array 118 is compared in the time spatial domain as shown in FIG. 6(*a*). The reduced crosstalk CMUT array 118 has a lower peak-to-peak crosstalk pressure than the regular array 100. The spectrum of the crosstalk pressure for the reduced crosstalk CMUT array 118 has a dip at 1.44 MHz compared to that for the regular array 100 having a single peak at 2.3 MHz as shown in FIG. 6(*b*).

In the displacement result of FIG. 3(*a*), the number of CMUT cells 104 in each element 206 can be easily identified to be 5 as expected because of the almost stationary posts. Although the displacement in the separation region 102 is much smaller than the displacement in the CMUT cells 104, the wave propagates uninterruptedly regardless of the discontinuity of the displacement on the interface. The interface waves carry most of their energy in the fluid medium as pressure waves. The displacement results for the reduced crosstalk CMUT array 118, shown in FIG. 3(*b*), demonstrate the higher amplitude reduction of the dispersive guided mode. Another observation is the propagation of the crosstalk in both forward and reverse directions as a consequence of reflection at the separation region 102. The guided mode for the regular array 100 is clearly visible over 20 neighboring elements 206 in FIG. 3(*a*), whereas the mode for the reduced crosstalk CMUT array 118 becomes obscure over 6 elements 206. Lamb Wave modes ($A_0$ and $S_0$) are negligibly affected by the modification in the separation region 102 because of the virtually unchanged substrate 106 thickness.

The continuity of the pressure across the cells 104 and the elements 206 of the array 100 in FIG. 3(*c*) verifies the strong coupling of the energy in the acoustic medium. The number of cells 104 in each element 206 and the number of elements 206 across a propagation distance cannot be determined from the pressure results. The pressure results for the reduced crosstalk CMUT array 118 shown in FIG. 3(*d*), confirm the higher amplitude reduction of the dispersive guided mode observed in the displacement results. The pressure which is close to zero in the separation region 102 acts to confine the guided mode within each array element 206 causing back and forth propagation, shown in FIG. 3(*d*). The effectiveness of the reduced crosstalk CMUT array 118 is clearly observed when the pressure results from identical CMUT arrays 100 that only differ with a membrane 120 in the separation region 102 are compared to each other, as shown in FIG. 3(*c*) and FIG. 3(*d*).

The physical meaning of the dip observed in FIG. 3(*f*) is that the crosstalk wave at a frequency of 1.44 MHz is not allowed to propagate across the array elements 206. The membrane 120 in the separation region 102 causes this dip and reduces the crosstalk. Lamb Wave modes, though more or less the same for both regular array 100 and reduced crosstalk CMUT array 118, are more apparent for the reduced crosstalk CMUT array 118 as shown in FIG. 3(*f*). The crosstalk level of the dispersive guided mode is approximately 10 dB smaller for the reduced crosstalk CMUT array 118. Additionally, the multiples of the guided mode, separated by 4 $mm^{-1}$ along the wavenumber at 2.3 MHz, has a higher amplitude in the reduced crosstalk CMUT array 118 than in the regular array 100. The amplitude of this multiple represents the discontinuity of the pressure, and higher amplitude means crosstalk reduction.

The crosstalk displacement and pressure are compared for both regular array 100 and the reduced crosstalk CMUT array 118 in the time-spatial domain as shown in FIGS. 3(*a, b, c,* and *d*). Analyzing the pressure of the regular array 100 in the frequency-wavenumber domain reveals that the dispersive guided mode is narrowband at a center frequency of 2.3 MHz. On the other hand, the acoustic pressure of the excited element 208 is broadband at a center frequency of 5.8 MHz. This discrepancy is related to the different phase conditions in transmission and reception. During transmission, 5 cells 104 of the excited element 208 are all pulsed in phase, as shown in FIG. 3(*c*). In-phase excitation causes higher center frequency and bandwidth for the transmitter element 208 than the center frequency and bandwidth of each individual cell 104. The cells 104 of the neighboring element 206 pick up the crosstalk waves sequentially along the interface FIG. 3(*c*). The phase delay between the cells 104 of an element 206 results in a lower center frequency (2.3 MHz) and bandwidth. The arrangement of the membranes 120 within the array element 206 influences the preferred frequency of the guided mode as a result of the phase delay between the adjacent cells 104. The stiffness and density of the membrane 120 also determine the phase velocity of the guided mode.

The narrowband of the guided mode and the cut-off frequency of the membrane 120 in the separation region 102 make this invention rewarding in better crosstalk performance FIG. 4. If the cut-off frequency of the membrane 120 falls outside the band of the guided mode, the reduced crosstalk CMUT array 118 will have negligible crosstalk improvement. To achieve higher amplitude reduction, the cut-off frequency of the membrane 120 should be even closer to the center frequency of the guided mode. However, this might increase the ringing of the transmitter element 208 and reduce the peak-to-peak acoustic pressure. Therefore, the membrane 120 is designed carefully to reduce the crosstalk without loss of the transmitter 208 output pressure using finite element methods.

An increase in the ringing of the transmitter element 208 is observed for the reduced crosstalk CMUT array 118 as a result of the reflections at the separation region 102. A possible solution to this problem is changing the direction of the reflected crosstalk waves to propagate in the elevation direction along the separation region 102 between the array elements 206, which will eliminate the ringing of the transmitter element 208.

Using the verified LS-DYNA model, a novel reduced crosstalk CMUT array 118 is provided to reduce the amplitude of the dispersive guided mode propagating in the fluid-solid interface. This invention reduces the crosstalk level from −23 dB to −33 dB without loss of the acoustic pressure of the transmitter element 208. The reduced crosstalk CMUT array 118 can be easily used for 1-D and 2-D CMUT arrays fabricated with surface micromachining or wafer-bonding to achieve superior crosstalk performance.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example the membrane 120 in the separation region 102 can be designed as a circular, square, hexagonal and tented shape. The membrane 120 can also be designed with electrical connections so that the membrane 120 can be deflected or collapsed on the substrate. Higher DC voltage will increase the contact radius and increase the center frequency of the membrane 120. Therefore, additional flexibility to tune this center frequency can be employed to adjust the crosstalk reduction efficiency. This will be particularly useful if the crosstalk wants to be reduced not only in conventional but also collapsed mode of operation. In our current example, if the crosstalk reduction wants to be employed in collapsed mode, 1 μm Si layer thickness should be increased to 1.4 μm to increase the center frequency of the membrane to account for the increase in the frequency of the dispersive guided mode.

All such variations are considered to be within the scope and spirit of the present invention as defined by the following claims and their legal equivalents.

What is claimed is:

1. A reduced crosstalk capacitive micromachined ultrasonic transducer (CMUT) array comprising:

a. at least two CMUT array elements deposited on a substrate;

b. at least one CMUT cell in said array element;

c. a separation region between adjacent said CMUT array elements; and d. a membrane formed in said separation region, whereby said membrane reduces crosstalk between said adjacent array elements, whereas said crosstalk comprises a dispersive guided mode of an ultrasonic signal from said CMUT propagating in a fluid-solid interface of said CMUT array.

2. The CMUT array of claim 1, wherein all said separation regions between said elements are substantially the same, whereby forming a substantial periodicity of said CMUT elements within said CMUT array.

3. The CMUT array of claim 2, wherein said periodicity of said array elements is in one dimension.

4. The CMUT array of claim 2, wherein said periodicity of said array elements is in two dimensions.

5. The CMUT array of claim 1, wherein all said membranes in said separation regions are substantially the same, whereby forming a substantial periodicity of said CMUT elements within said CMUT array.

6. The CMUT array of claim 1, wherein all said CMUT cells within said elements are substantially the same, whereby forming a substantial periodicity of said CMUT cells within said CMUT element.

7. The CMUT array of claim 1, wherein said CMUT operates in a conventional mode or a collapsed mode to transmit and receive ultrasound.

8. The CMUT array of claim 1, wherein said CMUT cell comprises:

a. an insulation layer deposited to said substrate;

b. a cell membrane layer deposited to said insulation layer, wherein said cell membrane layer has a gap therein;

c. an electrode layer deposited to said membrane layer, wherein said electrode layer covers a portion of said membrane layer; and d. a passivation layer, wherein said passivation layer is deposited to;

i. said electrode layer;

ii. said cell membrane layer; and iii. said insulation layer.

9. The CMUT array of claim 8, wherein said CMUT cell has a geometry selected from a group consisting of circular, square, hexagonal and tented.

10. The CMUT array of claim 8, wherein said insulation layer is a layer selected from a group consisting of silicon nitride and silicon oxide.

11. The CMUT array of claim 8, wherein said membrane layer is a layer selected from a group consisting of silicon nitride and silicon oxide.

12. The CMUT array of claim 8, wherein said electrode layer is a layer selected from a group consisting of aluminum and gold.

13. The CMUT array of claim 8, wherein said passivation layer is a layer selected from a group consisting of silicon nitride and silicon oxide.

14. The CMUT array of claim 8, wherein said gap is a vacuum gap.

* * * * *

UNITED STATES PATENT AND TRADEMARK OFFICE
CERTIFICATE OF CORRECTION

PATENT NO. : 7,745,973 B2
APPLICATION NO. : 11/789210
DATED : June 29, 2010
INVENTOR(S) : Baris Bayram et al.

It is certified that error appears in the above-identified patent and that said Letters Patent is hereby corrected as shown below:

Please substitute the paragraph beginning in Column 1, line 13, which currently reads:

"STATEMENT REGARDING FEDERALLY SPONSORED RESEARCH OR DEVELOPMENT
The present invention was supported in part by grant number HL67647 from the National Institute of Health, and supported in part by grant number N00014-02-1-0007 from the United States Office of Naval Research. The U.S. Government has certain rights in the invention."

with the following paragraph:

"STATEMENT REGARDING FEDERALLY SPONSORED RESEARCH OR DEVELOPMENT
This invention was made with Government support under contracts N00014-02-1-0007 awarded by the Office of Naval Research and CA099059 awarded by the National Institutes of Health. The Government has certain rights in this invention."

Signed and Sealed this

Thirtieth Day of November, 2010

David J. Kappos
*Director of the United States Patent and Trademark Office*